US010359465B2

(12) United States Patent
Sallem et al.

(10) Patent No.: US 10,359,465 B2
(45) Date of Patent: Jul. 23, 2019

(54) METHOD FOR CHARACTERIZING A SOFT FAULT IN A CABLE

(71) Applicant: COMMISSARIAT A L'ENERGIE ATOMIQUE ET AUX ENERGIES ALTERNATIVES, Paris (FR)

(72) Inventors: Soumaya Sallem, Nogent sur Oise (FR); Nicolas Ravot, Chelles (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 217 days.

(21) Appl. No.: 15/550,987

(22) PCT Filed: Feb. 12, 2016

(86) PCT No.: PCT/EP2016/053029
§ 371 (c)(1),
(2) Date: Aug. 14, 2017

(87) PCT Pub. No.: WO2016/131721
PCT Pub. Date: Aug. 25, 2016

(65) Prior Publication Data
US 2018/0024184 A1 Jan. 25, 2018

(30) Foreign Application Priority Data
Feb. 16, 2015 (FR) .................................. 15 51263

(51) Int. Cl.
*G01R 31/10* (2006.01)
*G01R 31/11* (2006.01)
*G01R 31/08* (2006.01)

(52) U.S. Cl.
CPC ............ *G01R 31/11* (2013.01); *G01R 31/083* (2013.01)

(58) Field of Classification Search
CPC .............................. G01R 31/083; G01R 31/11
(Continued)

(56) References Cited

FOREIGN PATENT DOCUMENTS

| CN | 102670250 A | * | 9/2012 | ............... A61B 8/00 |
| FR | 2 870 603 A1 | | 11/2005 | |
| JP | 2008-157897 A | | 7/2008 | |

OTHER PUBLICATIONS

Espacenet Translation CN-102670250-A (Year: 2019).*

(Continued)

*Primary Examiner* — Melissa J Koval
*Assistant Examiner* — Courtney G McDonnough
(74) *Attorney, Agent, or Firm* — Baker & Hostetler LLP

(57) ABSTRACT

A method for characterizing a fault affecting a cable in which a reference signal s of limited time support is injected and a measurement r of the reflection of the reference signal s in the cable is taken, comprises the following steps: identifying a section of the measurement r corresponding to a fault, this measurement section being called the signature of the fault; generating a modified reference signal s', of parameterizable amplitude, equal to the sum of the reference signal s and of the reference signal s inverted and delayed by a parameterizable delay; determining conjointly the values of the parameterizable delay and of the parameterizable amplitude that minimize the error between the modified reference signal s' and the signature of the fault; and deducing therefrom an estimation of the length of the fault from the determined value of the delay.

9 Claims, 6 Drawing Sheets

(58) Field of Classification Search
USPC .......................................... 324/527, 637–646
See application file for complete search history.

(56) References Cited

OTHER PUBLICATIONS

Espacenet Translate JP2008157897 (Year: 2019).*
G.F. Knoll, "Radiation Detection and Measurement: Chapter 17, Linear and Logic Pulse Functions," Wiley, 2nd edition, 1989, pp. 634-636.
T. Trigano et al., "Pileup Correction Algorithms for Nuclear Spectrometry," IEEE International Conference on Acoustics, Speech and Signal Processing, 2005.
M. Nakhostin et al., "A digital method for separation and reconstruction of pile-up events in germanium detectors," Review of Scientific Instruments, vol. 81, No. 103507, 2010, pp. 1-5.
M. Franchet et al., "Soft fault detection in cables using the cluster time-frequency domain reflectometry," IEEE Electromagnetic Compatibility Magazine, vol. 2, No. 1, Jan. 1, 2013, pp. 54-69, XP011510140.
L. Abboud et al., "Utilization of matched pulses to improve fault detection in wire networks," 2009 9th International Conference on Intelligent Transport Systems Telecommunications, Oct. 20, 2009, pp. 543-548, XP031619128.
S. Soumaya et al., "Self-adaptive correlation method for soft defect detection in cable by reflectometry," IEEE Sensors 2014 Proceedings, Nov. 2, 2014, pp. 2114-2117, XP032705584.

* cited by examiner

METHOD FOR CHARACTERIZING A SOFT FAULT IN A CABLE

CROSS-REFERENCE TO RELATED APPLICATIONS

This application is a National Stage of International patent application PCT/EP2016/053029, filed on Feb. 12, 2016, which claims priority to foreign French patent application No. FR 1551263, filed on Feb. 16, 2015, the disclosures of which are incorporated by reference in their entirety.

FIELD OF THE INVENTION

The invention relates to a method and system for characterizing a soft fault affecting an electrical cable. The field of the invention is that of wiring diagnostic systems based on the principle of reflectometry, in particular that of time-domain reflectometry.

BACKGROUND

Cables are omnipresent in all electrical systems, for the supply of power or transmission of information. These cables are subject to the same stresses as the systems that they connect and may be subject to failures. It is therefore necessary to be able to analyze their state and to return information on the detection of faults, but also on their location and their type, in order to help with maintenance. Conventional reflectometry methods allow this type of test to be carried out.

Reflectometry methods employ a principle that is close to that of radar: an electrical signal, the probe signal, often of high-frequency or wideband, is injected at one or more points into the cable to be tested. Said signal propagates through the cable or network and some of its energy is reflected when it encounters an electrical discontinuity. An electrical discontinuity may for example result from a connection, from the end of the cable or from a fault, or more generally from an abrupt change in the propagation conditions of the signal in the cable. Discontinuities most often result from faults that modify the characteristic impedance of the cable locally, thereby creating a discontinuity in its linear parameters.

The analysis of the reflected signals at the point of injection makes it possible to deduce therefrom information on the presence and location of these discontinuities, and therefore of any faults. An analysis in the time or frequency domain is conventionally carried out. These methods are designated by the acronyms TDR (for time-domain reflectometry) and FDR (for frequency-domain reflectometry).

SUMMARY OF THE INVENTION

The invention applies to any type of electric cable, in particular power transmission cables or communication cables, whether in fixed or mobile installations. The cables in question may be coaxial cables, twin-lead cables, parallel-line cables, twisted-pair cables or any other type of cable provided that it is possible to inject a reflectometry signal into it and to measure its reflection.

Known time-domain reflectometry methods are particularly suitable for detecting, in a cable, hard faults such as a short-circuit or an open circuit or more generally any significant local modification of the impedance of the cable. A fault is detected by measuring the amplitude of the signal reflected from this fault, which increases and therefore becomes more detectable as the hardness of the fault increases.

In contrast, a soft fault, for example resulting from a superficial degradation of the cladding, insulator or conductor of the cable, generates a low-amplitude peak in the reflected reflectometry signal and therefore one that is not easily detectable with conventional time-domain methods. Soft faults may in particular but not exclusively comprise faults such as a grazed or worn dielectric cladding, the start of degradation of the metal conductor or even compression of a cable.

The detection and location of soft faults in cables is a substantial problem for the industrial world because a fault in general first appears as a superficial fault but may, with time, progress to become more severe. For this reason in particular, it is useful to be able to detect the appearance of a fault as soon as it appears and at a stage at which its impact is superficial, in order to prevent it from becoming more severe.

Furthermore, one objective targeted by methods for analyzing by reflectometry is also to determine the size and characteristic impedance of a soft fault.

When the reflectometry signal used is a time-domain pulse, the signal reflected from the impedance discontinuities associated with the soft fault, has a signature that consists of two pulses of opposite signs. These pulses are partially superposed because most often the width of the time-domain pulse is larger than the size of the soft fault. As a result, the true signature of the fault is deformed, thus causing a loss of information regarding the precise characteristics of the fault, in particular its position, its size and its characteristic impedance.

A general objective of the invention is to improve the estimation of the position, size and characteristic impedance of a soft fault during the implementation of an analysis by time-domain reflectometry.

A first solution for solving the aforementioned problem is to decrease the size of the time-domain pulse of the signal injected into the cable so that this width is smaller than the length of the soft fault that it is desired to detect. However, this method runs up against limits in terms of the frequency passband available for the signals injected into the cable to be analyzed.

Various techniques have been proposed, in the literature, for mitigating the aforementioned problem related to the superposition or pile-up of pulses during the reflection of the signal from impedance discontinuities related to a soft fault. It has thus been shown that the use of signal processing tools, such as linear finite impulse response filters, allows two pulses to be un-piled, one pulse being retained and the second, which is treated as noise, being rejected. Such a method is in particular described in document [1]. This method has drawbacks related to the loss of information regarding the second pulse, this decreasing its field of application, and the dependency of its effectiveness on the parameters of the filter.

Another method for un-piling pulses is described in documents [2] and [3]. This method, applied in the field of spectroscopy, is based on a statistical approach. It consists of a measuring method including a succession of main pulses of durations temporally spaced apart from one another and possibly each consisting of a stack of elementary pulses of duration X and the energy of which is evaluated via a variable Y possessing a property of additivity. The elementary pulses have instants of appearance $T_i$ that follow a homogeneous Poisson process. The limits of this approach reside in its complexity and in the fact that it is applicable only when the process of arrival of the pulses is known or possible to determine.

Article [4], the authors of which present a digital method for processing piled-up pulses in the spectra generated by germanium detectors (for detecting x-rays and gamma rays) is also known. In this approach, digital acquisition techniques have been used to record the piled-up waveforms, which are then processed by a "fitting" or de-convolution algorithm in order to recover the original pulses. The method is based on a suitable adjustment of the detected signals, with a suitable pulse-shaping digital filter. The analysis is presented for pile-up events formed by two signals, and may be extended to the pile-up of several signals.

Nevertheless, this method cannot be applied to the signature of a soft fault because it requires prior knowledge of the time period of the pulses and a good precision regarding the detection of the start of the pile-up. It is not able to separate piled-up pulses of opposite directions (destructive pile-up) and does not allow very close pulses to be separated. It remains limited by its main drawback which consists of its computational complexity, which makes it difficult to integrate into an electronic board.

The present invention aims to provide an alternative solution to the methods of the prior art, which allows the problem of superposition of pulses during the reflection of the analysis signal from a soft defect to be solved. The invention provides a method and a device that allow the length of the soft fault, its characteristic impedance and its position in the cable to be determined with precision.

Thus, one subject of the invention is a method for characterizing a fault affecting a cable in which a reference signal s of limited time support is injected and a measurement r of the reflection of said reference signal s in the cable is taken, characterized in that said method comprises the following steps:

identifying a section of the measurement r corresponding to a fault, this measurement section being called the signature of the fault;

generating a modified reference signal s', of parameterizable amplitude, equal to the sum of said reference signal s and of said reference signal s inverted and delayed by a parameterizable delay;

determining conjointly the values of the parameterizable delay and of the parameterizable amplitude that minimize the error between the modified reference signal s' and the signature of the fault; and deducing therefrom an estimation of the length of the fault from the determined value of said delay.

According to one variant embodiment, the method according to the invention furthermore comprises the following step:

deducing, from the determined amplitude value, an estimation of the reflection coefficient of the signal level with the fault then an estimation of the characteristic impedance of the cable level with the fault.

According to one variant embodiment, the duration of the time support of the reference signal s is made parameterizable and the method according to the invention furthermore comprises a step of determining the value of said duration that minimizes the error between the modified reference signal s' and the signature of the fault.

According to one variant embodiment, the method according to the invention furthermore comprises the following steps:

determining an estimation of the position of the middle of the fault from the signature of the fault in the measurement r of the reflection of the reference signal; and determining an estimation of the position of the start of the fault by subtracting from the position of the middle of the fault half the length of the fault.

According to one variant embodiment, an estimation of the position of the middle of the fault is determined from the middle of the time interval [t1; t2] where t1 is the time abscissa of the maximum amplitude of the signature of the fault and t2 the time abscissa of the minimum amplitude of the signature of the fault.

According to one particular aspect of the invention, the reference signal s is a time-domain pulse.

Other subjects of the invention are a computer program including instructions for executing the method for characterizing a fault affecting a cable according to the invention, when the program is executed by a processor and a processor-readable storage medium on which is stored a program including instructions for executing the method for characterizing a fault affecting a cable according to the invention, when the program is executed by a processor.

Yet another subject of the invention is a device for characterizing a fault affecting a cable comprising means for injecting a reference signal s at a point of the cable, means for measuring a reflection r of said signal in the cable and computing means suitable for implementing the method for characterizing a fault affecting a cable according to the invention.

BRIEF DESCRIPTION OF THE DRAWINGS

Other features and advantages of the present invention will become more clearly apparent on reading the following description with reference to the appended drawings, which show.

DETAILED DESCRIPTION

Figure 1A:
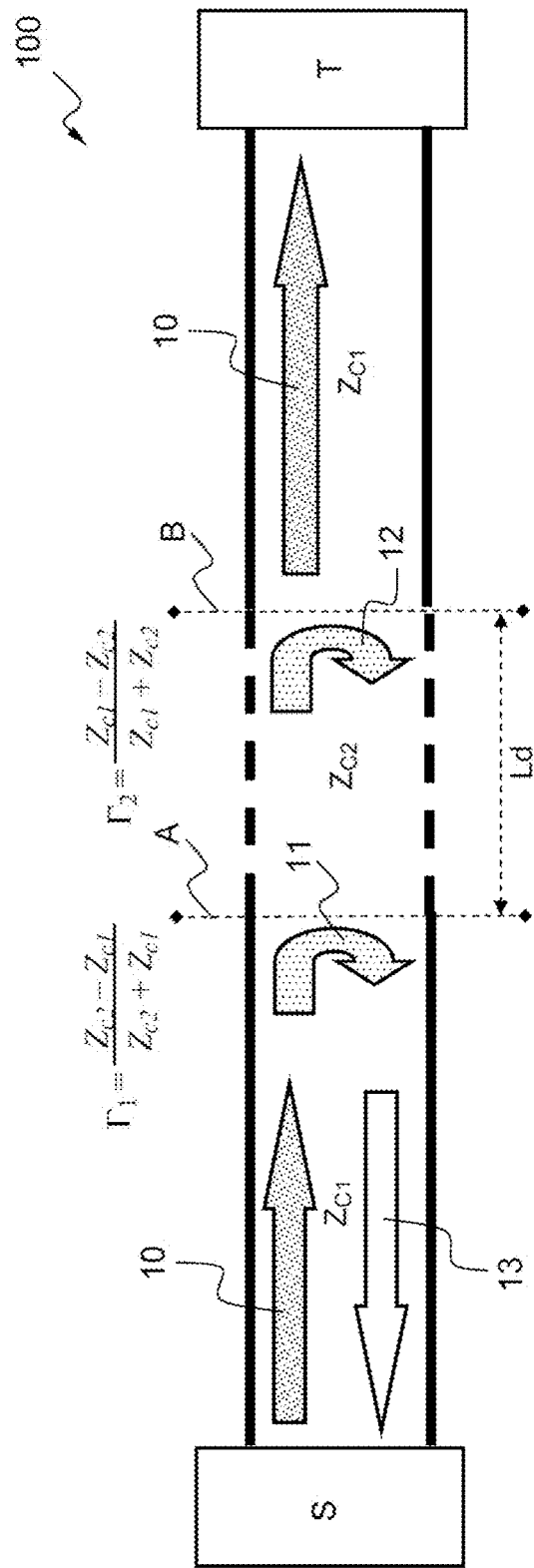
FIGS. 1a and 1b, schematic diagrams illustrating the pulse pile-up effect in the context of the characterization of soft faults in a cable.

FIG. 1a shows, in a schematic diagram, a transmission line 100, for example an electrical cable, of ends referenced S and T.

The cable 100 is affected by a soft fault, for example a superficial degradation of the cladding of the cable, which extends from point A to point B in the cable.

According to a well-known principle, in order to locate the fault, a method that is what is referred to as a reflectometry method is applied, which consists in injecting a signal 10 of known form at one end S of the cable. This signal may be a signal of limited time support, for example a time-domain pulse, time-domain reflectometry then being spoken of. The incident signal 10 propagates along the cable 100 and meets a first point A corresponding to the start of the soft fault. At this point A, a first impedance discontinuity may be observed when the signal passes from a medium of characteristic impedance $Z_{c1}$ corresponding to the healthy cable to a medium of characteristic impedance $Z_{c2}$ corresponding to the cable affected by the soft fault. The latter causes a very small variation in characteristic impedance, typically of about a few ohms.

The incident signal 10 is reflected at point A to produce a first reflected signal 11 then at point B to produce a second reflected signal 12. The first reflected signal 11 and the second reflective signal 12 are of opposite signs because the first reflected signal corresponds to a reflection from the medium of characteristic impedance $Z_{c1}$ to the medium of characteristic impedance $Z_{c2}$ and the second reflected signal corresponds to a reflection from the medium of characteristic impedance $Z_{c2}$ to the medium of characteristic impedance $Z_{c1}$.

The two reflected signals 11, 12 pile-up into an overall reflected signal 13 that back-propagates to the point of injection S.

Figure 1B:
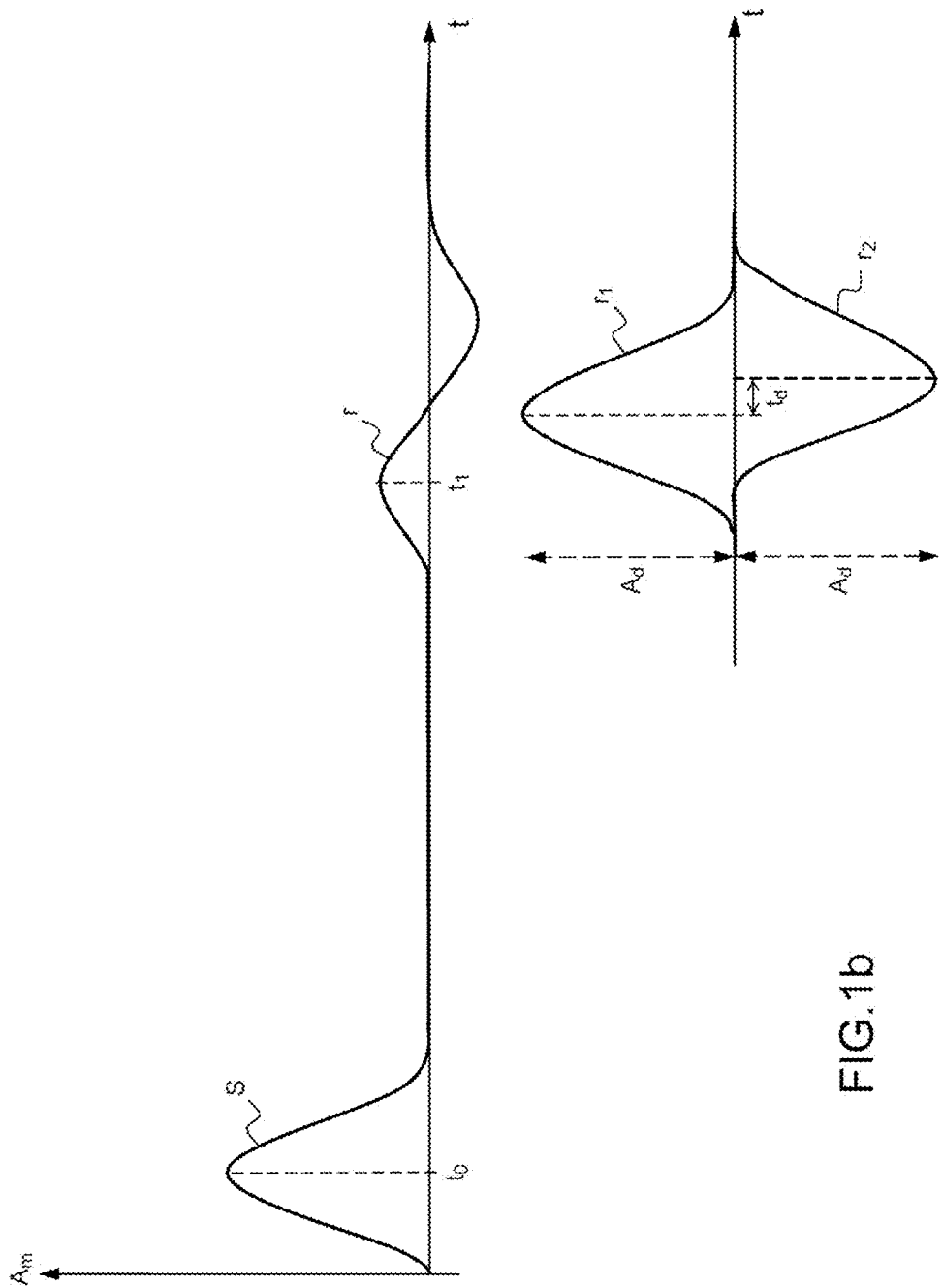

FIG. 1b illustrates (in the top portion of the figure) a time-domain reflectogram obtained after the injection at the point S of the cable 100 of a time-domain pulse 10 and the measurement at the same point S of the reflected signal 13.

The injected time-domain pulse s and the signature r of the signal 13 reflected from the soft fault may be seen in this time-domain reflectogram.

This signature r results, as indicated in the bottom portion of FIG. 1b, from the pile-up of a first pulse $r_1$ reflected from the entrance of the fault and a second pulse $r_2$, of opposite sign to the first pulse, reflected from the exit of the fault.

The superposition or pile-up of these two pulses leads to a signature r that does not allow the fault to be correctly characterized. Specifically, its amplitude and its width are not directly exploitable to deduce the characteristic impedance and length of the fault because they are deformed with respect to the pulse actually injected into the cable. For example, the measurement of the width of the reflected pulse r does not allow a measurement of the length of the fault to be determined directly.

Figure 2:
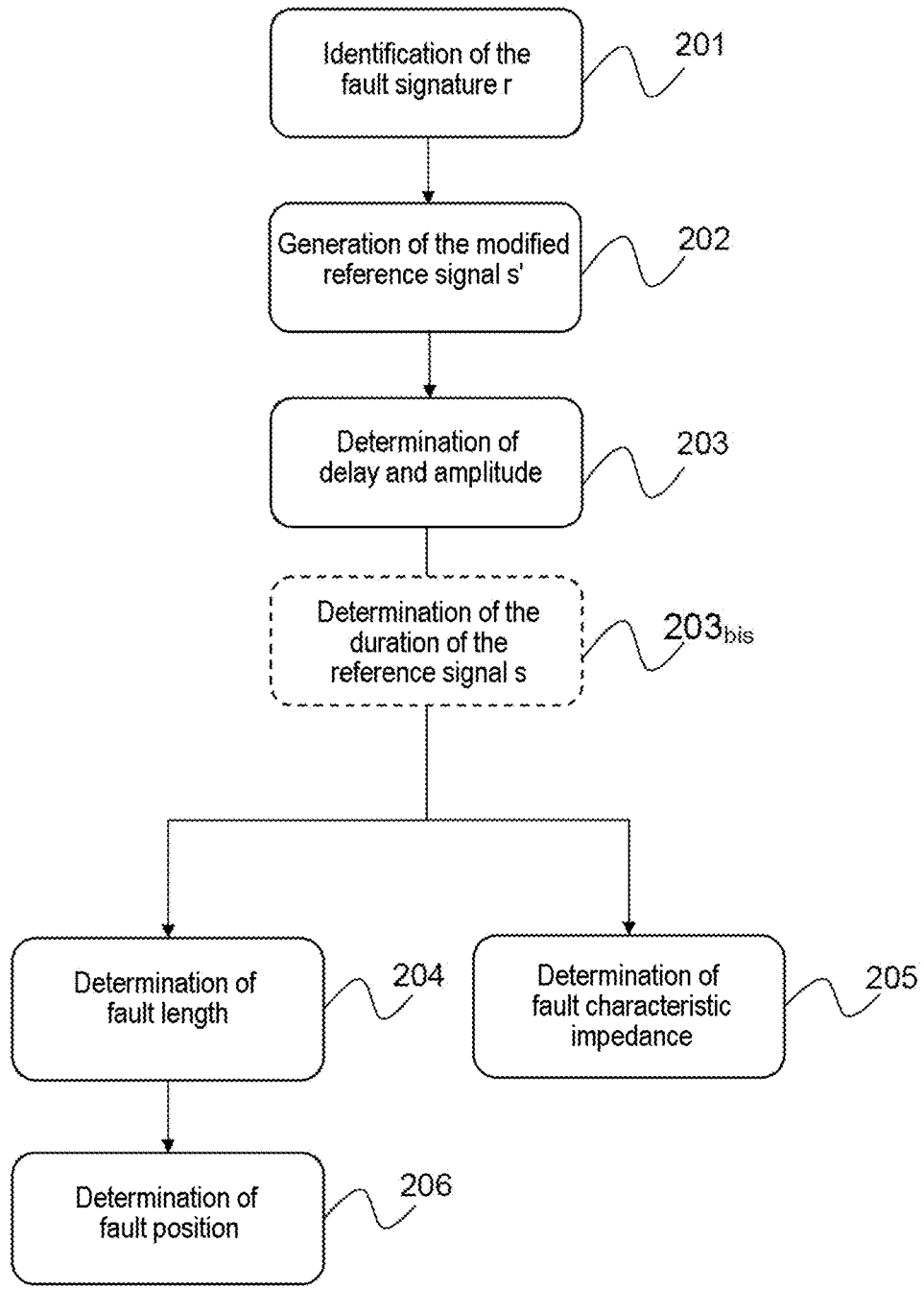
FIG. 2, a flowchart illustrating the steps of the method for characterizing faults according to the invention.

To mitigate this problem, the invention provides a method described in FIG. 2, which comprises the following steps.

In a first step 201, the signature r corresponding to a soft fault is identified in the measured reflectogram. In other words, in the measured reflectogram, the section of the measurement that seems to correspond to a reflection of the signal from a soft fault is isolated.

Figure 3:
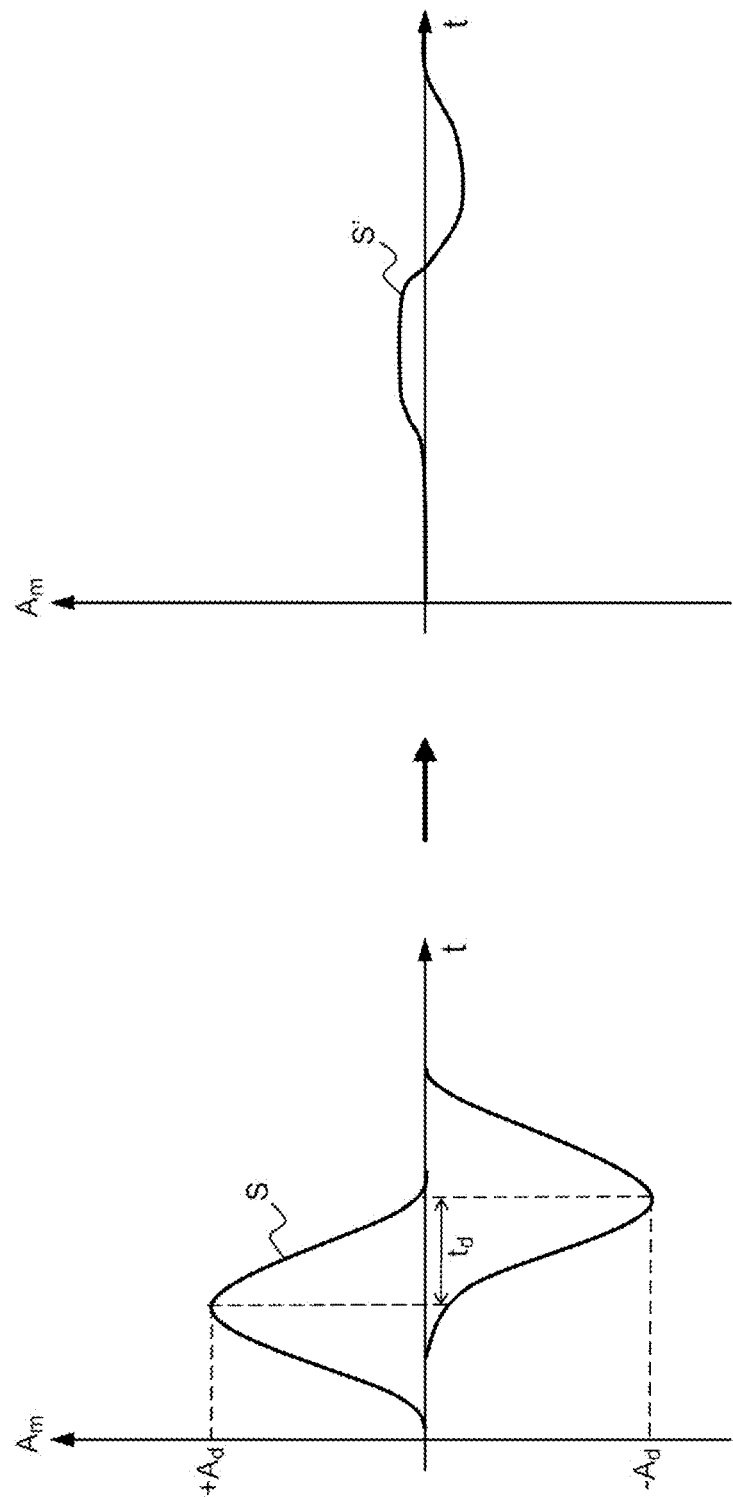
FIG. 3, a schematic diagram illustrating the step of generating a modified reference signal s'.

In a second step 202, a modified reference signal s' is generated from the reference signal s injected into the cable. The modified reference signal s' is obtained by summing the reference signal s and the same signal inverted and delayed by a parameterizable time $t_d$. This operation is illustrated in FIG. 3, which shows, on the left of the figure, the reference signal s and its inverse delayed by a time $t_d$, and on the right of the figure, the modified reference signal s' obtained by summing the reference signal s and this inverted and delayed signal. The amplitude $A_d$ of the modified signal s' is also made parameterizable.

In a third step 203, the error between the modified reference signal s' and the signature r measured and isolated in the first step 201 is calculated. This error may be determined by calculating the sum of the absolute value of the differences, point by point, between the modified reference signal s' and the signature r. Beforehand, the two signals are temporally aligned on a common reference point that may, for example, be the middle of the interval between the abscissa of the point of maximum amplitude and the abscissa of the point of minimum amplitude.

The error between the modified reference signal and the signature r may be determined by other criteria used in known Maximum Likelihood algorithms. In particular this error may be equal to the sum of the differences raised to the square between a point of the modified reference signal s' and a point of the signature r.

The error between the modified reference signal s' and the signature r may be minimized by other criteria used in known Maximum Likelihood algorithms.

In particular, this error may be equal to the route of the sum of the differences raised to the square between the signal s' and the signature r, point by point. More generally, the error may also be equal to the sum raised to the power 1/p of the absolute values of the differences, point by point, raised to the power p between the two signals.

$$E=(\Sigma_k|s'(k)-r(k)|^p)^{1/p}$$

Next, the value of the delay $t_d$ and the value of the amplitude $A_d$ that allow the lowest error between the two compared signals to be obtained is sought. To do this, an iterative process is carried out that consists in modifying the value of the delay $t_d$, for example by giving it in turn each of a range of preset values, and in calculating for each value, the corresponding error between the two signals. Likewise, for each value of the delay $t_d$, the amplitude $A_d$ is varied in a range of preset values and, for each amplitude value, the corresponding error between the two signals is calculated. In the end, the value of the delay and the value of the amplitude that allow the smallest error to be obtained are retained. This process is an Maximum Likelihood method. The search for the values of delay and amplitude allowing the error between the two signals to be minimized is carried out conjointly.

The value of the delay $t_d$ retained in fine corresponds to the time passed between the reflection of the injected signal from the entrance point of the fault and the reflection of the injected signal from the exit point of the fault. From this time, it is possible to deduce an estimate of the length of the fault.

According to one variant embodiment of the invention, a third optional parameter may be added to configure the modified reference signal s' in addition to the delay $t_d$ and the amplitude $A_d$. This third parameter is the duration of the time support of the reference signal s. In the same way as explained above, the duration of the time support of the reference signal may be made variable in a range of preset values. This parameter may then be integrated into the Maximum Likelihood method in the following way. Once the optimal amplitude and delay values have been determined at the end of step 203, the error between the modified reference signal s' and the signature r is once again calculated, in an additional step $203_{bis}$, for each possible value of the duration of the time support of the reference signal. At the end of step $203_{bis}$, the duration value that gives the smallest error is retained.

Step $203_{bis}$ of determining the optimal duration of the time support of the reference signal may be executed successively to step 203 of conjoint determination of the optimal amplitude and delay values but may also be executed before this step 203.

In a successive step 204, the length of the soft fault is thus estimated from the value of the delay retained in step 203. The length of the fault may, for example, be obtained using the following relationship: $L=V \cdot t_d/2$ where V is the propagation speed of the signal in the cable. The propagation speed may, for example, be obtained from knowledge of the total length of the cable and the length of time between the instant of injection of the signal into the cable and its reflection from the end of the cable, this length of time possibly being measured on the time-domain reflectogram.

It should be noted that the propagation speed of the signal through the fault may vary slightly with respect to the nominal propagation speed of the cable. To be entirely correct, it would be necessary to use a measurement V of the propagation speed of the signal through the fault. However, in practice, a measurement V of the propagation speed of the signal in the cable, which may be provided by the manufacturer of the cable, is sufficient to obtain a precise measurement of the length of the fault L from the value of the delay $t_d$.

From the obtained amplitude value, an estimate of the characteristic impedance of the soft fault is deduced in a step 205. This estimate may be obtained by considering the retained amplitude value to be an estimate of the reflection coefficient of the signal level with the soft fault and from knowledge of the characteristic impedance of the cable using the following well-known relationship:

$$\Gamma = \frac{Z_{c2} - Z_{c1}}{Z_{c2} + Z_{c1}},$$

where $\Gamma$ is the reflection coefficient, $Z_{c1}$ is the characteristic impedance of the cable and $Z_{c2}$ the characteristic impedance of the soft fault.

In one variant embodiment of the invention, an additional step 206 is added to the method with the aim of precisely determining the position of the start of the fault in the cable.

The identification of the signature r of the soft fault in the reflectogram, allows a first approximate estimation of the position of the fault in the cable. This estimation is for example obtained from the measurement of the delay, in the time-domain reflectogram, between the abscissa $t_0$ of the peak of the injected signal pulse corresponding to the point of injection and the abscissa $t_1$ of the peak of the pulse r corresponding to the signature of the soft fault in the reflectogram.

Figure 4:
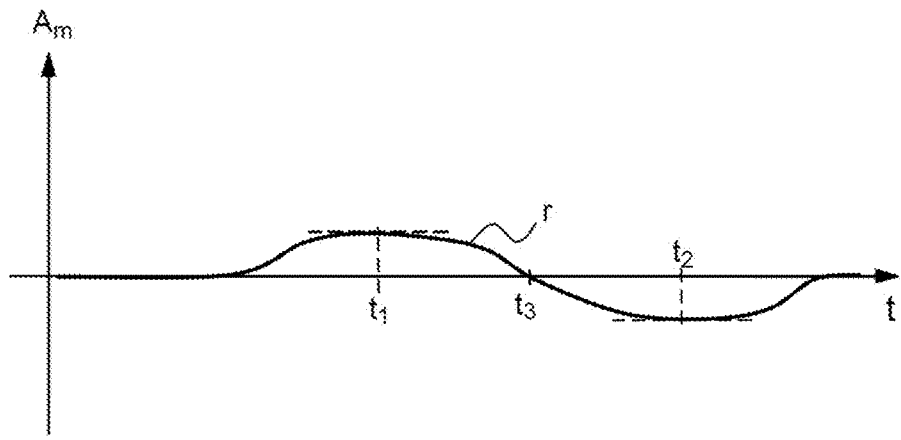
FIG. 4, a schematic diagram illustrating the step of determining the position of a soft fault.
Figure 4:
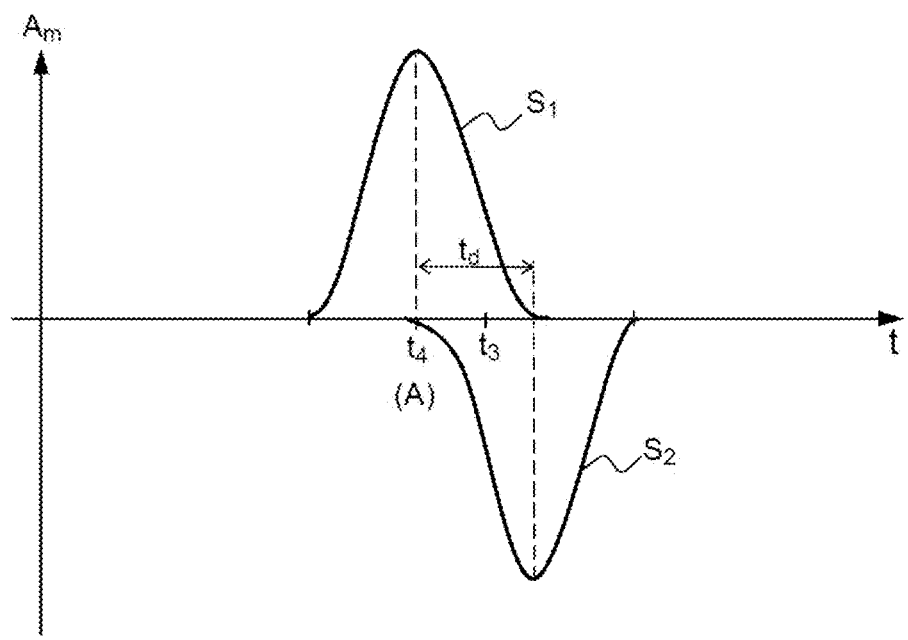

FIG. 4 illustrates the implementation of the step 206 of refining the estimation of the position of the fault.

The top part of FIG. 4 shows the time-domain reflectogram of the measured signature r of the soft fault.

In this reflectogram, a reference point $t_3$ corresponding to the middle of the soft fault is measured. The time $t_3$ is for example equal to the middle of the time interval $[t_1; t_2]$ where $t_1$ is the time abscissa corresponding to the maximum amplitude of the measurement r and $t_2$ is the time abscissa corresponding to the minimum amplitude of the measurement r.

The bottom part of FIG. 4 shows the two pulses $s_1$ and $s_2$, separated by a time delay td, that serve as the basis for generating the modified reference signal s' such as explained in step 202 of the method. The group composed of the two pulses $s_1$ and $s_2$ is centered on the time $t_3$ measured from the signature r so as to center this group on a point corresponding to the middle of the soft fault.

From the reflectogram illustrated in the bottom part of FIG. 4, it may be seen that the actual position of the point A where the soft fault starts corresponds, in the reflectogram, to a moment in time delayed by td/2 with respect to the time $t_3$. On the basis of this observation, the moment in time $t_4$ corresponding to the actual start of the soft fault is defined as being equal to $t_4=t_3-td/2$, td being the delay retained at the end of step 203 of the method.

From the moment in time $t_4$, the actual position of the start of the fault is deduced either from the propagation speed of the signal in the cable or via a proportionality relationship since the length of the cable is known.

The step 206 of refining the position of the fault takes into account the reference-signal time-support duration obtained at the end of step 203$_{bis}$ when the latter is implemented.

Although the examples given in FIGS. 1 to 4 show a reference signal taking the form of a Gaussian pulse, the invention is not limited to this signal form alone and is applicable to any reflectometry signal having a limited time support.

The invention has the advantage of allowing a more reliable estimation of the characteristics of length, position and characteristic impedance of a soft fault.

Figure 5:
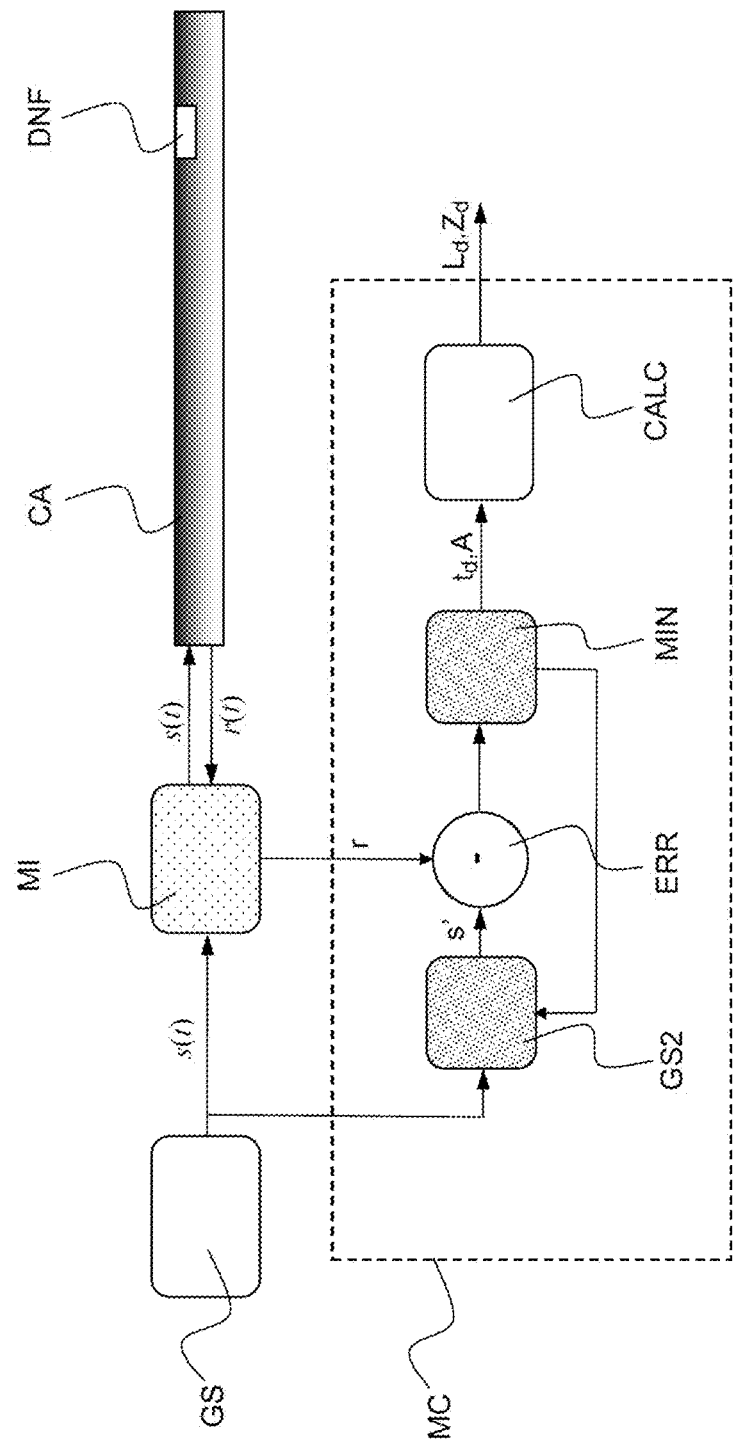
FIG. 5, a schematic diagram of an exemplary device configured to implement the invention.

FIG. 5 shows a schematic diagram of an example of a reflectometry system able to implement the method according to the invention.

A reflectometry system or reflectometer includes at least one means GS for generating a test signal s and injecting it into the cable to be analyzed CA, a measuring means MI for measuring the signal r reflected in the cable CA and an electronic component MC, of integrated circuit type, such as a programmable logic circuit, for example an FPGA or microcontroller, for example a digital signal processor, that receives a copy of the injected signal s(t) and measures the reflected signal r(t) and is configured to execute the method described in FIG. 2, in order to determine the characteristics of a soft fault.

The means GS may consist of a generator of analog signals, for example signals taking the form of Gaussian pulses or any other signals of limited time support. The means for injecting the signal into the cable may consist of a coupler that may also serve to acquire a measurement of the reflected signal. If the signal is generated digitally, the means GS also comprises an analog-to-digital converter for converting the digital signal into an analog signal before its injection into the cable and a digital-to-analog converter for performing the inverse operation after the acquisition of the measurement of the reflected signal.

The injection of the signal into the cable and the measurement of the reflected signal may be done by the same component but also by two separate components, in particular when the injection point and the measurement point are disassociated.

The system described in FIG. 5 may be implemented by an electronic board on which are placed the various components. The injecting and coupling means may be connected to an input/output that the board includes.

Furthermore, a processing unit, such as a computer or personal digital assistant inter alia may be used to control the reflectometry device and display the results of the computations performed by the component MC on a human-machine interface.

The method according to the invention may be implemented on the component MC on the basis of hardware and/or software elements.

When the component MC is implemented on the basis of hardware elements, it includes at least one second signal generator GS2 for producing a modified reference signal s' from the reference signal s and amplitude and delay parameters. A comparator ERR allows the error between the modified reference signal s' and the signature of a soft fault in the measurement of the reflected signal r to be calculated. A computational module MIN performs the search for the minimum error and the associated amplitude and delay parameters $A_d$ and $t_d$.

A computational module CALC lastly allows the characteristics of the fault in terms of length, characteristic impedance and position to be determined from the delivered amplitude and delay values $A_d$ and $t_d$.

The method according to the invention may also be implemented exclusively by way of computer program, the method then being applied to a reflectometry measurement r acquired beforehand using a conventional reflectometry device. In such a case, the invention may be implemented by way of computer program including instructions for its execution. The computer program may be stored on a processor-readable storage medium.

REFERENCES

[1] G. F. Knoll: Radiation Detection and Measurement. Wiley, 2nd ed., 1989
[2] T. Trigano, E. Barat, T. Dautremer and T. Brisset: "Mesure et Traitement d'un Signal Comprenant des Empilements d'Impulsions Elémentaires", French Patent 2 870 603
[3] T. Trigano, E. Barat, T. Dau-tremer and A. Souloumiac: Pileup Correction Algorithms for Nuclear Spectrometry, IEEE International Conference on Acoustics, Speech and Signal Processing, 2005
[4] M. Nakhostin, Zs. Podolyak, P. H. Regan, P. M. Walker: A digital method for separation and reconstruction of pile-up events in germanium detectors, Department of Physics, University of Surrey, Guildford GU2 7XH, UK

The invention claimed is:

1. A method for characterizing a fault affecting a cable in which a reference signal s of limited time support is injected and a measurement r of the reflection of said reference signal s in the cable is performed, wherein said method comprises the steps of:
identifying a section of the measurement r corresponding to a fault, this measurement section being called the signature of the fault;
generating a modified reference signal s', of parameterizable amplitude, equal to the sum of said reference signal s and of said reference signal s inverted and delayed by a parameterizable delay;
determining conjointly the values of the parameterizable delay and of the parameterizable amplitude that minimize the error between the modified reference signal s' and the signature of the fault; and
deducing therefrom an estimation of the length of the fault from the determined value of said delay.

2. The method for characterizing a fault affecting a cable of claim 1, furthermore comprising the step of:
deducing, from the determined amplitude value, an estimation of the reflection coefficient of the signal level with the fault then an estimation of the characteristic impedance of the cable level with the fault.

3. The method for characterizing a fault affecting a cable of claim 1, wherein the duration of the time support of the reference signal s is made parameterizable, said method furthermore comprising a step of determining the value of said duration that minimizes the error between the modified reference signal s' and the signature of the fault.

4. The method for characterizing a fault affecting a cable of claim 1 further comprising the steps of:
determining an estimation of the position of the middle of the fault from the signature of the fault in the measurement r of the reflection of the reference signal; and
determining an estimation of the position of the start of the fault by subtracting from the position of the middle of the fault half the length of the fault.

5. The method for characterizing a fault affecting a cable of claim 4, wherein an estimation of the position of the middle of the fault is determined from the middle of the time interval [t1; t2] where t1 is the time abscissa of the maximum amplitude of the signature of the fault and t2 the time abscissa of the minimum amplitude of the signature of the fault.

6. The method for characterizing a fault affecting a cable of claim 1, wherein the reference signal s is a time-domain pulse.

7. A computer program comprising instructions stored on a tangible non-transitory storage medium for executing on a processor a method for characterizing a fault affecting a cable in which a reference signal s of limited time support is injected and a measurement r of the reflection of said reference signal s in the cable is performed, wherein said method comprises the steps of:
identifying a section of the measurement r corresponding to a fault, this measurement section being called the signature of the fault;
generating a modified reference signal s', of parameterizable amplitude, equal to the sum of said reference signal s and of said reference signal s inverted and delayed by a parameterizable delay;
determining conjointly the values of the parameterizable delay and of the parameterizable amplitude that minimize the error between the modified reference signal s' and the signature of the fault; and
deducing therefrom an estimation of the length of the fault from the determined value of said delay.

8. A tangible non-transitory processor-readable recording medium on which is recorded a program comprising instructions for executing a method for characterizing a fault affecting a cable in which a reference signal s of limited time support is injected and a measurement r of the reflection of said reference signal s in the cable is performed, wherein said method comprises the steps of:
identifying a section of the measurement r corresponding to a fault, this measurement section being called the signature of the fault;
generating a modified reference signal s', of parameterizable amplitude, equal to the sum of said reference signal s and of said reference signal s inverted and delayed by a parameterizable delay;
determining conjointly the values of the parameterizable delay and of the parameterizable amplitude that minimize the error between the modified reference signal s' and the signature of the fault; and
deducing therefrom an estimation of the length of the fault from the determined value of said delay.

9. A device for characterizing a fault affecting a cable comprising an injecting device for injecting a reference signal s at a point of the cable, a measurement device for measuring a reflection r of said signal in the cable and a calculator configured for implementing a method for characterizing a fault affecting a cable in which a reference signal s of limited time support is injected and a measurement r of the reflection of said reference signal s in the cable is performed, wherein said method comprises the steps of:
identifying a section of the measurement r corresponding to a fault, this measurement section being called the signature of the fault;
generating a modified reference signal s', of parameterizable amplitude, equal to the sum of said reference signal s and of said reference signal s inverted and delayed by a parameterizable delay;

determining conjointly the values of the parameterizable delay and of the parameterizable amplitude that minimize the error between the modified reference signal s'5 and the signature of the fault; and deducing therefrom an estimation of the length of the fault from the determined value of said delay.

\* \* \* \* \*